US010847738B2

(12) United States Patent
Zhu et al.

(10) Patent No.: US 10,847,738 B2
(45) Date of Patent: Nov. 24, 2020

(54) NANOCOMPOSITE COATINGS FOR PEROVSKITE SOLAR CELLS AND METHODS OF MAKING THE SAME

(71) Applicant: Alliance for Sustainable Energy, LLC, Golden, CO (US)

(72) Inventors: Kai Zhu, Littleton, CO (US); Zhiwen Ma, Golden, CO (US); John Mehmet Dagdelen, Alameda, CA (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 251 days.

(21) Appl. No.: 15/487,988

(22) Filed: Apr. 14, 2017

(65) Prior Publication Data

US 2017/0301480 A1 Oct. 19, 2017

Related U.S. Application Data

(60) Provisional application No. 62/322,972, filed on Apr. 15, 2016.

(51) Int. Cl.
*H01L 51/44* (2006.01)
*H01L 51/42* (2006.01)
*H01G 9/20* (2006.01)

(52) U.S. Cl.
CPC ........ *H01L 51/448* (2013.01); *H01L 51/4226* (2013.01); *H01G 9/2077* (2013.01); *H01L 2251/306* (2013.01); *Y02E 10/549* (2013.01)

(58) Field of Classification Search
None
See application file for complete search history.

(56) References Cited

U.S. PATENT DOCUMENTS

| 2003/0175411 A1 | 9/2003 | Kodas et al. |
| 2012/0009416 A1 | 1/2012 | Lai et al. |
| 2015/0129034 A1 | 5/2015 | Snaith et al. |

FOREIGN PATENT DOCUMENTS

| WO | WO 2015/164731 A1 | 10/2015 |
| WO | WO 2015/184197 A2 | 12/2015 |

OTHER PUBLICATIONS

International Search Report from corresponding PCT patent application PCT/US17/27728; dated Jul. 18, 2017; 3 pages.
Written Opinion from corresponding PCT patent application PCT/US17/27728; dated Jul. 18, 2017; 5 pages.
Bauer et al., "Epoxy / SiO2 Interpenetrating Polymer Networks", Polymers for Advanced Technologies, 1996, vol. 7, pp. 333-339.
Wojcik et al., "High molecular weight poly(ethylene oxide) / silica hybrids by the sol-gel process", Materials Science and Engineering, 1998, C 6, pp. 115-120.

(Continued)

*Primary Examiner* — Shannon M Gardner
(74) *Attorney, Agent, or Firm* — Michael A. McIntyre

(57) ABSTRACT

An aspect of the present disclosure is a method that includes, in a first mixture that includes a metal alkoxide and water, reacting at least a portion of the metal alkoxide and at least a portion of the water to form a second mixture that includes a solid metal oxide phase dispersed in the second mixture, applying the second mixture onto a surface of a device that includes an intervening layer adjacent to a perovskite layer such that the intervening layer is between the second mixture and perovskite layer, and treating the second mixture, such that the solid metal oxide phase is transformed to a first solid metal oxide layer such that the intervening layer is positioned between the first solid metal oxide layer and the perovskite layer.

22 Claims, 8 Drawing Sheets

(56) References Cited

OTHER PUBLICATIONS

Amberg-Schwab, S., "Inorganic-Organic Polymers with Barrier Properties Against Water Vapor, Oxygen and Migrating Monomers," Chapter 21, Handbook of Sol-Gel Science and Technology, 24 pages.

Grätzel, M., "The light and shade of perovskite solar cells," Nature Materials, vol. 13, Sep. 2014, pp. 838-842.

Jeon, N. et al., "Solvent engineering for high-performance inorganic-organic hybrid perovskite solar cells," Nature Materials, vol. 13, Sep. 2014, pp. 897-903.

Mailoa, J. et al., "A 2-terminal perovskite/silicon multijunction solar cell enabled by a silicon tunnel junction," Applied Physics Letters, vol. 106, 2015, pp. 121105-1 through 121105-4.

Mei, A. et al., "A hole-conductor-free, fully printable mesoscopic perovskite solar cell with high stability," Science, vol. 345, Issue 6194, Jul. 18, 2014, pp. 295-298.

Nam, S. et al., "Solvent-free solution processed passivation layer for improved long-term stability of organic field-effect transistors," Journal of Materials Chemistry, vol. 21, 2011, pp. 775-780.

Niu, G. et al., "Study on the stability of $CH_3NH_3PbI_3$ films and the effect of post-modification by aluminum oxide in all-solid-state hybrid solar cells," Journal of Materials Chemistry A, vol. 2, 2014, pp. 705-710.

Niu, G. et al., "Review of recent progress in chemical stability of perovskite solar cells," Journal of Materials Chemistry A, vol. 3, 2015, pp. 8970-8980.

Wen, J. et al., "Organic/Inorganic Hybrid Network Materials by the Sol-Gel Approach," Chemical Materials, vol. 8, 1996, pp. 1667-1681.

Xiao, M. et al., "A Fast Deposition-Crystallization Procedure for Highly Efficient Lead Iodide Perovskite Thin-Film Solar Cells," Angew. Chemistry, vol. 126, 2014, pp. 10056-10061.

Zhou, Y. et al., "Room-temperature crystallization of hybrid-perovskite thin films via solvent-solvent extraction for high-performance solar cells," Journal of Materials Chemistry A, vol. 3, 2015, pp. 8178-8184.

A　　　　　　　　B

NANOCOMPOSITE COATINGS FOR PEROVSKITE SOLAR CELLS AND METHODS OF MAKING THE SAME

CROSS-REFERENCE TO RELATED APPLICATIONS

This application claims priority to U.S. Provisional Application No. 62/322,972 filed Apr. 15, 2016, the contents of which are incorporated herein by reference in its entirety.

CONTRACTUAL ORIGIN

The United States Government has rights in this disclosure under Contract No. DE-AC36-08GO28308 between the United States Department of Energy and the Alliance for Sustainable Energy, LLC, the Manager and Operator of the National Renewable Energy Laboratory.

BACKGROUND

Perovskites are a class of crystalline materials with the structure $ABX_3$ that show promise as solar absorber materials. Perovskite solar cells with certified efficiencies up to 21% can be produced with solution-based processes, making the technology an attractive, inexpensive alternative to silicon. However, the stability of perovskite solar cells is an issue that still needs to be solved.

SUMMARY

An aspect of the present disclosure is a method that includes, in a first mixture that includes a metal alkoxide and water, reacting at least a portion of the metal alkoxide and at least a portion of the water to form a second mixture that includes a solid metal oxide phase dispersed in the second mixture, applying the second mixture onto a surface of a device that includes an intervening layer adjacent to a perovskite layer such that the intervening layer is between the second mixture and perovskite layer, and treating the second mixture, such that the solid metal oxide phase is transformed to a first solid metal oxide layer such that the intervening layer is positioned between the first solid metal oxide layer and the perovskite layer.

In some embodiments of the present disclosure, the metal alkoxide may include $Si(OR)_4$ and the R group may include an alkyl group. In some embodiments of the present disclosure, the R group may include a polymeric group. In some embodiments of the present disclosure, the polymeric group may include at least one of a polystyrene group, a polyamide group, a poly(ethyleneimine) group, an epoxy group, a poly(ethylene oxide) group, a poly(oxypropylene) group, a poly(arylene ether phosphine oxide) group, a poly(arylene ether sulfone) group, a cellulose acetate group, a polyacrylic group, a polyacrylonitrile group, and/or a polybutadiene group.

In some embodiments of the present disclosure, the solid metal oxide phase may include a first network of interconnected silicon atoms that includes at least one of $SiO_2$, $SiO_{1.5}OH$, $SiO(OH)_2$, $SiO_{0.5}(OH)_3$, $SiO_{1.5}R$, $SiOR_2$, $SiO_{0.5}R_3$, $SiO_{0.5}(OH)R_2$, $SiO_{0.5}(OH)_2R$, and/or $SiO(OH)R$ and a first amount of unreacted $Si(OR)_4$. In some embodiments of the present disclosure, the first solid metal oxide layer may include a second network of interconnected silicon atoms comprising at least one of $SiO_2$, $SiO_{1.5}OH$, $SiO(OH)_2$, $SiO_{0.5}(OH)_3$, $SiO_{1.5}R$, $SiOR_2$, $SiO_{0.5}R_3$, $SiO_{0.5}(OH)R_2$, $SiO_{0.5}(OH)_2R$, and/or $SiO(OH)R$ and a second amount of unreacted $Si(OR)_4$ that is less than the first amount.

In some embodiments of the present disclosure, the first mixture may further include an alcohol. In some embodiments of the present disclosure, the first mixture may further include $R'[Si(OR)_3]_x$ where x is an integer value between 1 and 10 inclusively. In some embodiments of the present disclosure, the R' group may include an organic group. In some embodiments of the present disclosure, the organic group may include at least one of an alkane group, an alkene group, and/or an aromatic group. In some embodiments of the present disclosure, the first network may further include at least one of $SiO_{1.5}R'_{0.5}$, $SiOR'$, $SiO_{0.5}R'_{1.5}$, $SiO(OH)R'_{0.5}$, $SiO_{0.5}(OH)R'$, or $Si(OH)R'_{1.5}$. In some embodiments of the present disclosure, the second network may further include at least one of $SiO_{1.5}R'_{0.5}$, $SiOR'$, $SiO_{0.5}R'_{1.5}$, $SiO(OH)R'_{0.5}$, $SiO_{0.5}(OH)R'$, or $Si(OH)R'_{1.5}$.

In some embodiments of the present disclosure, the reacting may be performed at a temperature between 25° C. and 95° C. In some embodiments of the present disclosure, the applying may be performed by at least one of dip coating, curtain coating, and/or spin coating. In some embodiments of the present disclosure, the intervening layer may include a second solid metal oxide layer. In some embodiments of the present disclosure, the second solid metal oxide layer may be substantially transparent to sunlight. In some embodiments of the present disclosure, the second solid metal oxide layer may include nickel oxide. In some embodiments of the present disclosure, the second solid metal oxide layer may have a thickness between 10 Å and 500 Å. In some embodiments of the present disclosure, the perovskite may include $ABX_3$, where X includes an anion, A includes a first cation, and B includes a second cation.

In some embodiments of the present disclosure, the method may further include prior to the applying, depositing the second solid metal oxide layer onto the perovskite layer. In some embodiments of the present disclosure, the depositing may be performed by atomic layer deposition. In some embodiments of the present disclosure, the method may further include prior to the depositing, forming the perovskite layer. In some embodiments of the present disclosure, the forming may be performed by at least one of a solution method or a vapor phase method. In some embodiments of the present disclosure, the treating may include at least one of heating the second mixture and/or exposing the second mixture to a gas.

An aspect of the present disclosure is a device that includes a perovskite layer and at least one metal oxide layer adjacent to the perovskite layer. In some embodiments of the present disclosure, the at least one metal oxide layer may include a silica-containing layer. In some embodiments of the present disclosure, the at least one metal oxide layer may further include a nickel oxide layer positioned between the perovskite layer and the silica-containing layer.

BRIEF DESCRIPTION OF THE DRAWINGS

Exemplary embodiments are illustrated in referenced figures of the drawings. It is intended that the embodiments and figures disclosed herein are to be considered illustrative rather than limiting.

Panel A) illustrates a first network that forms a solid metal oxide phase and/or solid, and Panel B) illustrates a second network that forms a solid metal oxide phase and/or solid having R groups linking neighboring silicon atoms.

Figure 3:
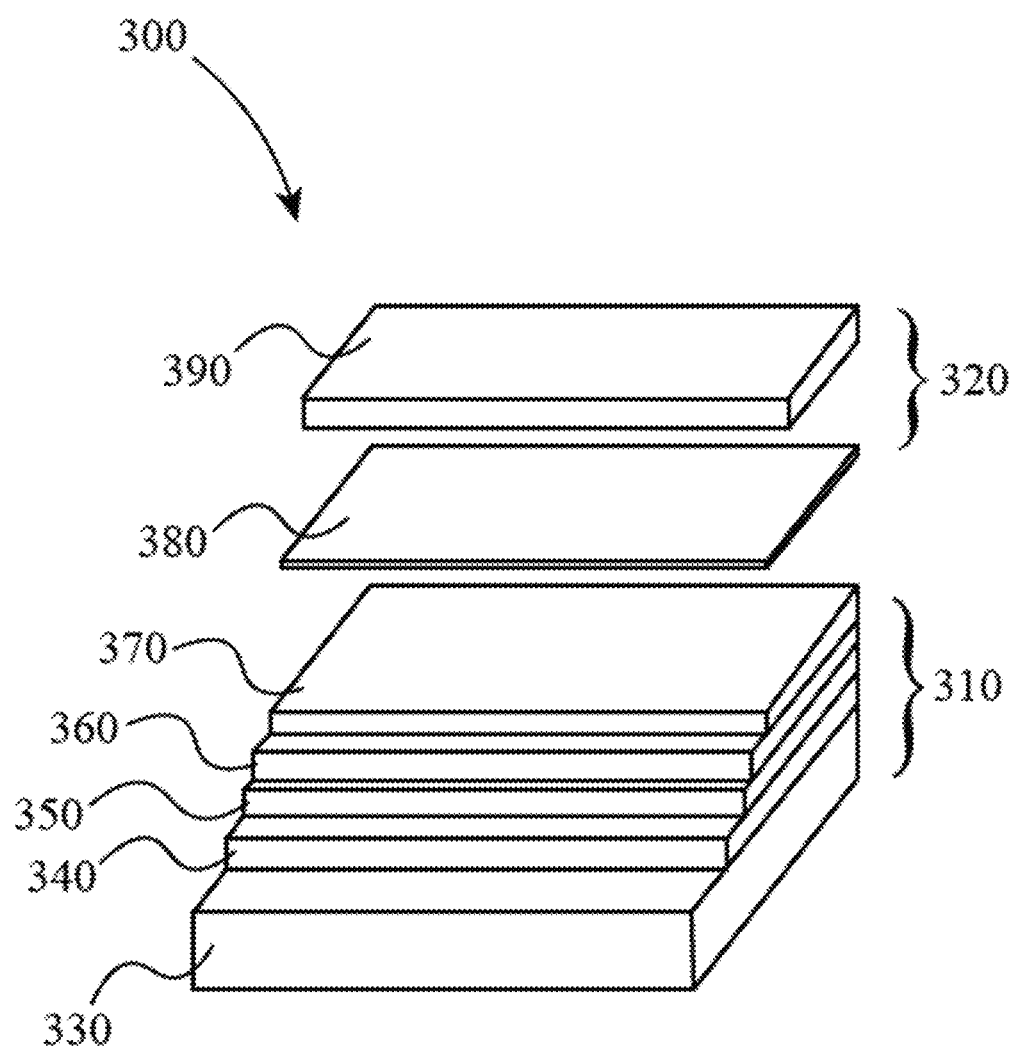

FIG. 3 illustrates the architecture of a planar perovskite solar cell (PSC) protected by at least a sol-gel produced metal oxide coating, according to some embodiments of the present disclosure.

Figure 4:
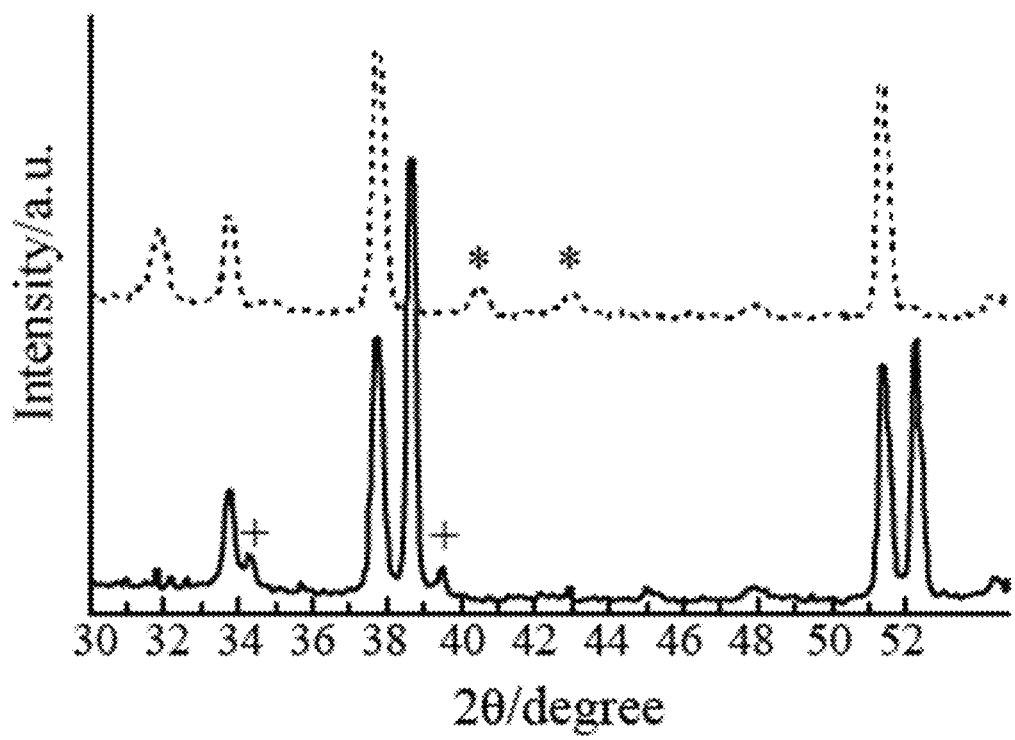

FIG. 4 illustrates X-ray diffraction patterns of a perovskite thin film before (dashed line) and after degradation (solid line) due to exposure the environment.

Figure 5:
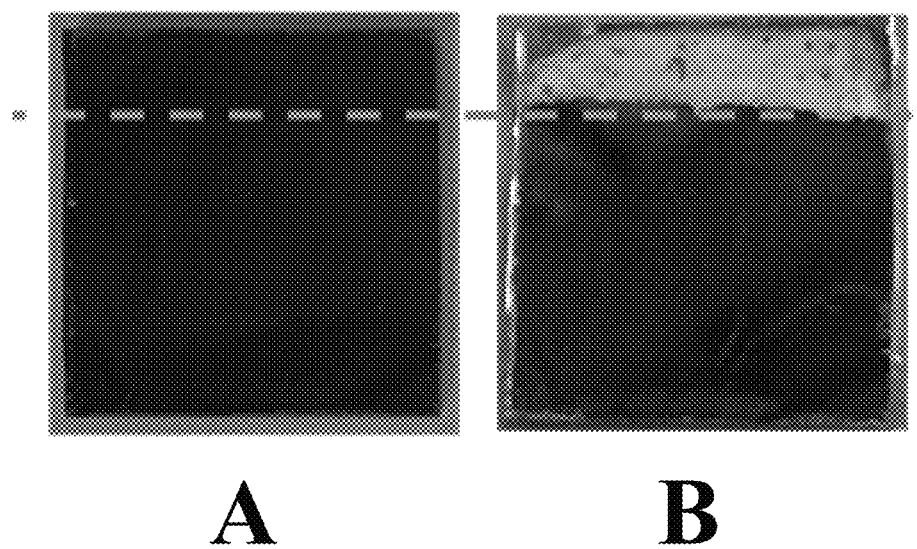

FIG. 5 illustrates effects of a protective inorganic silica sol-gel coating on a perovskite thin-film, according to some embodiments of the present disclosure; (Panel A) sample as-coated; (Panel B) the same sample after 48 hours in ambient conditions.

Figure 6:
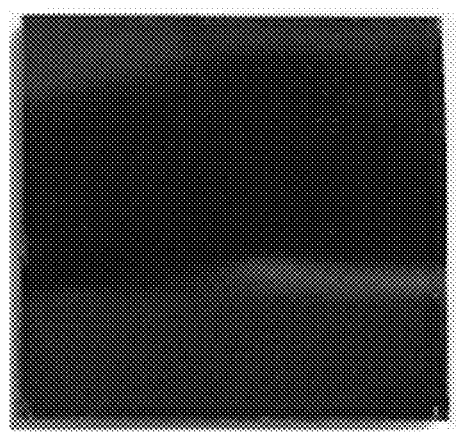
Figure 6:
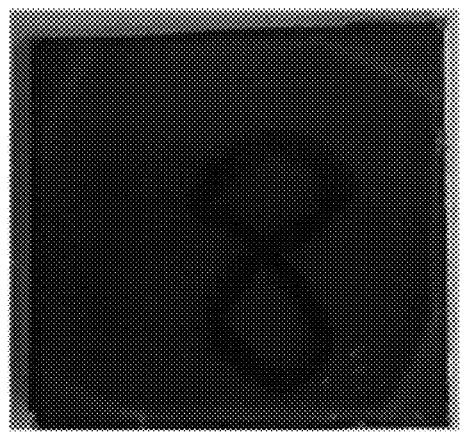

FIG. 6 illustrates effects of a sol-gel produced metal oxide coating on a perovskite layer, according to some embodiments of the present disclosure; (Panel A) sample as-coated (reflection visible); (Panel B) the same sample after more than 2 weeks in ambient conditions.

Figure 7:
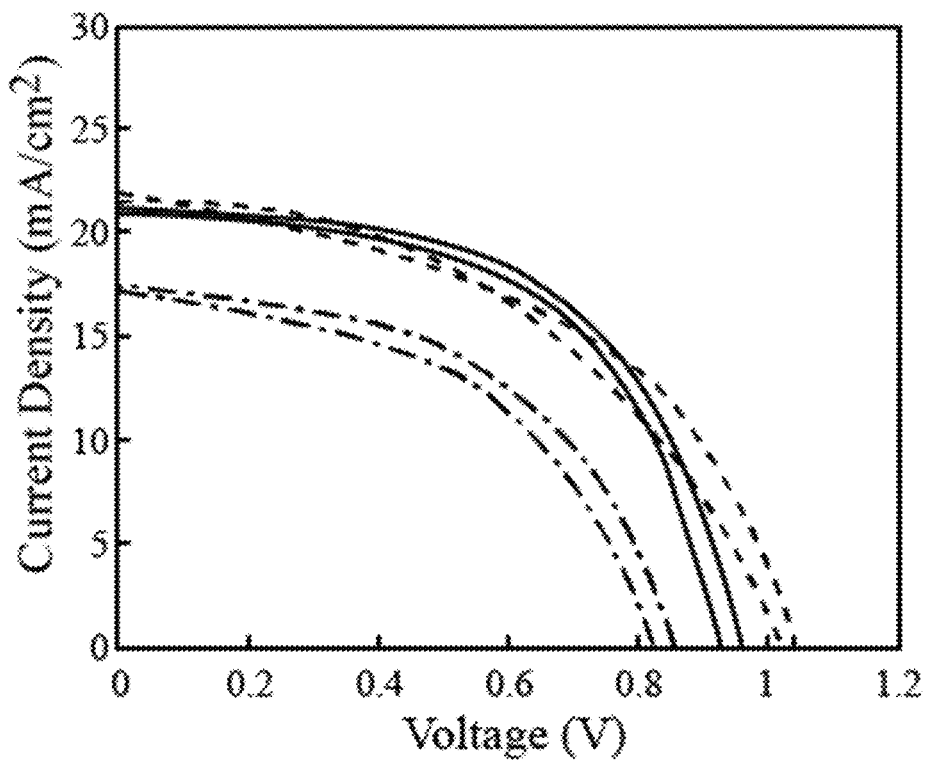

FIG. 7 illustrates current density-voltage (J-V) curve for coated and uncoated perovskite solar cells over time, according to some embodiments of the present disclosure.

Figure 8:
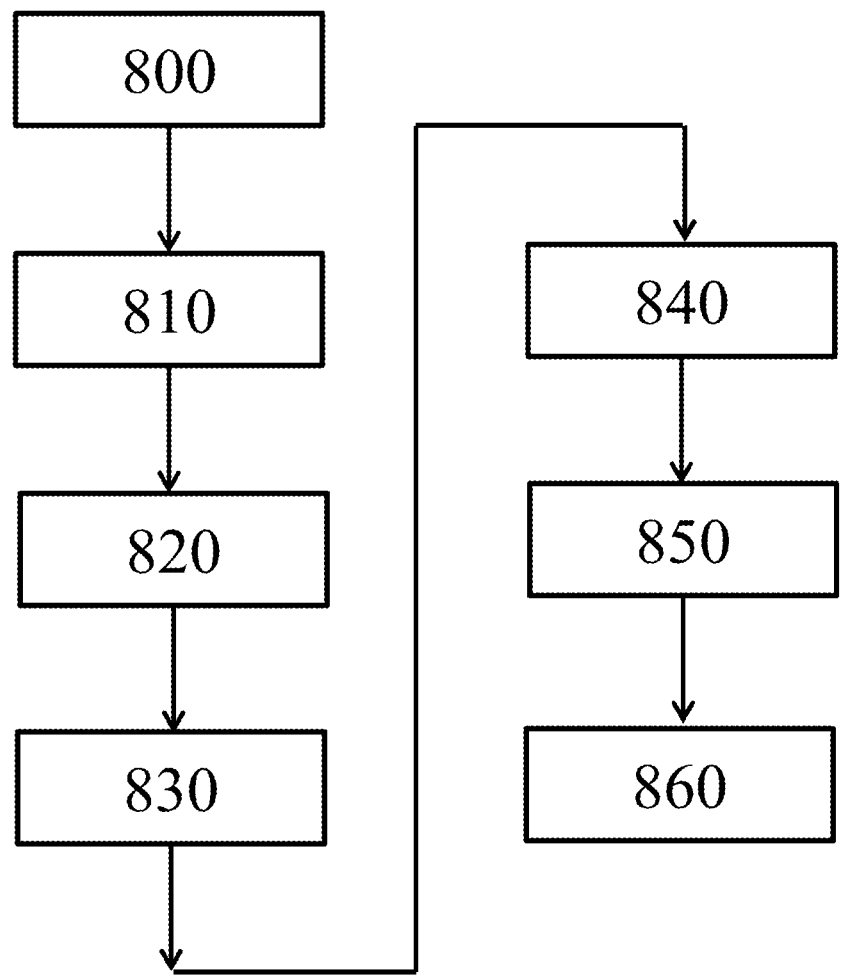

FIG. 8 illustrates a flow chart summarizing a method for making a coated perovskite device with improved life, according to some embodiments of the present disclosure.

REFERENCE NUMBERS

100 . . . perovskite
110 . . . A-cation
120 . . . B-cation
130 . . . anion (X)
300 . . . device
310 . . . perovskite photovoltaic device layers
320 . . . protective layers
330 . . . fluorine-doped tin oxide (FTO) layer
340 . . . titanium dioxide ($TiO_2$) layer
350 . . . perovskite layer
360 . . . hole-transport layer
370 . . . contact layer
380 . . . intervening layer
390 . . . solid metal oxide layer
800 . . . cleaning a substrate
810 . . . depositing a $TiO_2$ layer
820 . . . depositing a perovskite layer
830 . . . depositing a hole transport layer
840 . . . depositing a contact layer
850 . . . depositing an intervening layer
860 . . . depositing a solid metal oxide layer

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

Figure 1:
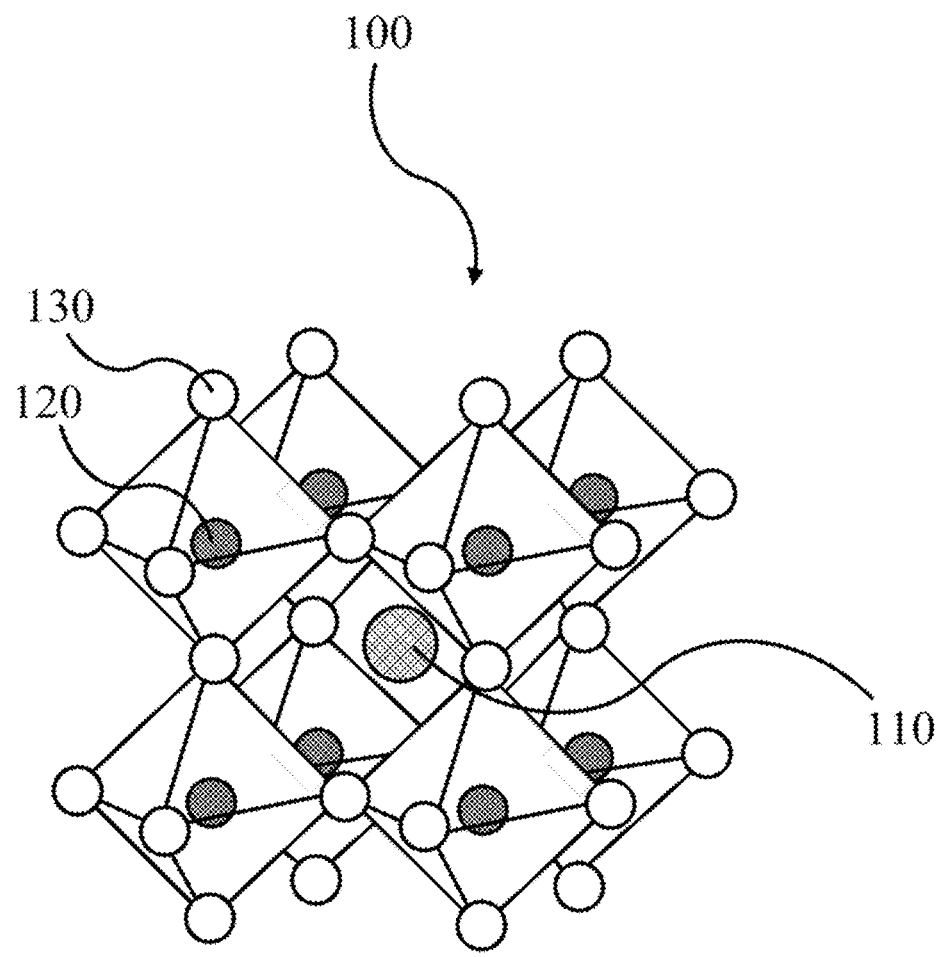
FIG. 1 illustrates a schematic of a perovskite material, according to some embodiments of the present disclosure.

FIG. 1 illustrates that a perovskite may organize into cubic crystalline structures and may be described by the general formula $ABX_3$, where X (130) is an anion and A (110) and B (120) are cations, typically of different sizes with the A-cation 110 typically larger than the B-cation 120. In a cubic unit cell, the B-cation 120 resides at the eight corners of a cube, while the A-cation 110 is located at the center of the cube, and with 12 X-anions 130 centrally located along each edge of the unit cell, between B-cations 120. Typical inorganic perovskites include calcium titanium oxide (calcium titanate) minerals such as, for example, $CaTiO_3$ and $SrTiO_3$. In some embodiments of the present invention, the A-cation 110 may include a nitrogen-containing organic compound such as an alkyl ammonium compound. The B-cation 120 may include a metal and the anion 130 may include a halogen.

Additional examples for an A-cation A 110 include organic cations and/or inorganic cations. A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH^{3+}$), ethylammonium ($CH_3CH_2NH^{3+}$), propylammonium ($CH_3CH_2 CH_2NH^{3+}$), butylammonium ($CH_3CH_2 CH_2 CH_2NH^{3+}$), formamidinium ($NH_2CH=NH^{2+}$), and/or any other suitable nitrogen-containing organic compound. In other examples, an A-cation 110 may include an alkylamine. Thus, an A-cation 110 may include an organic component with one or more amine groups. For example, an A-cation 110 may be an alkyl diamine halide such as formamidinium $(CH(NH_2)_2)^+$.

Examples of metal B-cations 120 include, for example, lead, tin, germanium, and or any other 2+ valence state metal that can charge-balance the perovskite 100. Examples for the anion 130 include halogens: e.g. fluorine, chlorine, bromine, iodine and/or astatine. In some cases, a perovskite 100 may include more than one anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cation 120, and the anion 130 (X) may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 100 may have more than one halogen element, where the various halogen elements are present in none integer quantities; e.g. x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure.

As stated above, the A-cation 110 may include an organic constituent in combination with a nitrogen constituent. In some cases, the organic constituent may be an alkyl group such as straight-chain and/or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Perovskite solar cells are surprisingly tolerant of material defects and are easily prepared with solution-based processes, which are major advantages over other photovoltaic (PV) technologies. Thus, perovskite solar cells have the potential to be a photovoltaic technology capable of decreasing the cost of solar energy. However, the potential stability issue of these materials still has not been resolved, which poses a barrier to these materials entering the market. Thus, the present disclosure relates to coating methods that use sol-gels to improve the resistance of perovskite solar cells to degradation.

The term "sol-gel" refers to a chemical synthesis method generally used to create metal oxide ceramics. Sol-gel chemical synthesis methods involve the hydrolysis of metal alkoxide precursors (sols) to form loose networks (gels), which form porous structures as water and other alcohol byproducts of the reaction evaporate. This may be followed by an elevated temperature sintering step to increase the density of the dry films. Such methods enable the production of a wide range of organically modified metal alkoxysilanes, in some embodiments, in the form of thin layers and/or films. These materials may be introduced into a sol-gel system along with various network-forming organic molecules to increase film density as a result of cross-linking between organic and inorganic polymer chains. This also allows dense films to be deposited onto sensitive substrates that are intolerant of a high-temperature sintering step. Thus, the present disclosure relates to sol-gel methods for producing protective barriers for underlying perovskite solar cells, as described below.

In some embodiments of the present disclosure, a sol-gel process may utilize a wet-chemical technique to produce a glassy and/or ceramic layer on top of a perovskite layer and/or some other layer of a photovoltaic device. In some embodiments, a sol-gel process may start with a solution that is transformed to a two-phase mixture that contains both a liquid phase and a solid phase. This transformation may occur due to hydrolysis and/or condensation reactions of precursor compounds, which results in the formation a gel-like mixture, hence the term "sol-gel". Such a solid/liquid mixture may also be referred to as a colloid. In some embodiments of the present disclosure, a sol-gel may be produced by base-catalyzed reactions and/or acid-catalyzed reactions. In some embodiments, the sol-gel may be produced by the formation of an inorganic network. For example, a metal oxide sol-gel may occur by connecting metal centers with metal-oxygen-metal and/or metal-hydroxy-metal bridges, thereby creating metal-oxo and/or metal-hydroxo polymers in the solution. These reactions, resulting in a sol-gel containing both solid and liquid phases, may be followed by one or more drying steps to remove at least a portion of the liquid phase to produce a solid, protective, sol-gel layer on the perovskite layer. Thus, one or more drying steps may be utilized to produce a final amorphous glass and/or crystalline ceramic layer, which provides at least some protection to the perovskite layer from the external environment; e.g. atmospheric moisture, etc.

Figure 2:
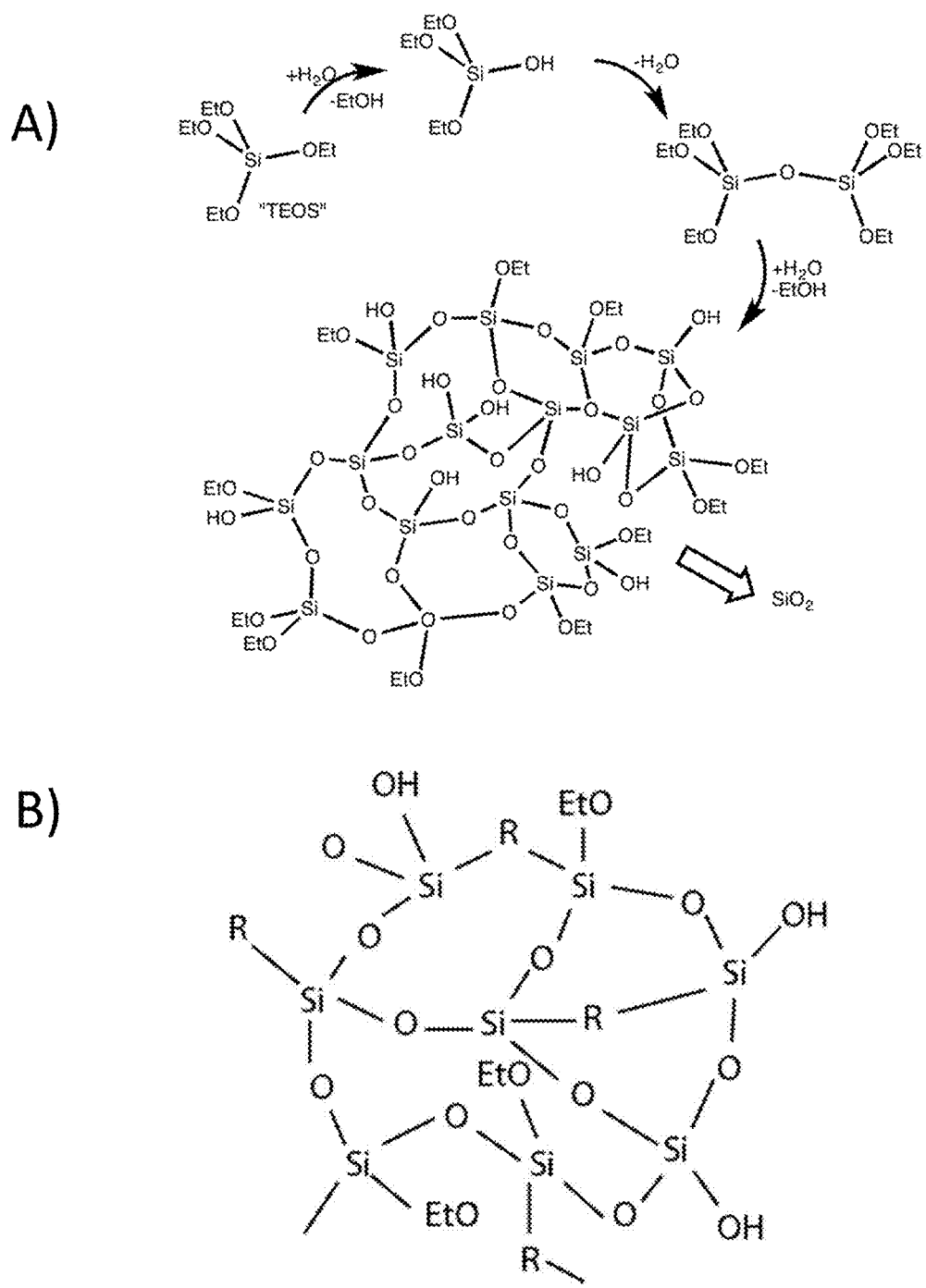
FIG. 2 illustrates a schematic of condensation reactions for converting tetraethyl orthosilicate (TEOS) into a sol-gel, according to some embodiments of the present disclosure.

FIG. 2 Panel A) illustrates a simplified version of condensation reactions for converting tetraethyl orthosilicate (TEOS), an alkoxide, into a sol-gel, and a resulting network of interconnecting silicon atoms. TEOS is Si(OC$_2$H$_5$)$_4$, or Si(OR)$_4$ where R is equal to C$_2$H$_5$. Alkoxides are suitable reactants for producing sol-gels because they react readily with water, e.g. by hydrolysis, as shown by, Si(OR)$_4$+H$_2$O 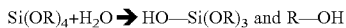 HO—Si(OR)$_3$ and R—OH With sufficient water and catalyst, the hydrolysis reaction may proceed to completion to produce silica by, Si(OR)$_4$+2H$_2$O  SiO$_2$+4R—OH.

Complete hydrolysis may require excess water and/or the use of a hydrolysis catalyst such as acetic acid and/or hydrochloric acid. Intermediate species may include (OR)$_2$—Si—(OH)$_2$ and/or (OR)$_3$—Si—(OH), resulting from partial hydrolysis. Early intermediates may result from two partially hydrolyzed monomers linked via a siloxane bond, Si—O—Si:

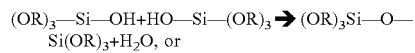

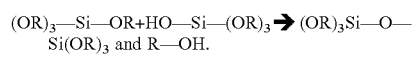

FIG. 2 Panel B) illustrates another example of a network of interconnecting silicon atoms, in this case where an R group provides linkages between neighboring silicon atoms.

Thus, such reactions may result in the formation of 1-, 2-, or 3-dimensional networks of siloxane bonds and the concurrent production of water and R—O—H species. Polymerization of a silicon alkoxide may lead to a complex branching of the resultant polymer because a fully hydrolyzed Si(OH)$_4$ monomer is tetrafunctional in that it can have four branches from a single silicon atom. Alternatively, under certain conditions (e.g. low water concentration) fewer than four of these branching sites may condense, resulting in less branching in the final polymer product. In some embodiments, one or more alcohols may be used a solvent for the sol-gel reactants (e.g. alkoxides and water). The resultant metal oxide layer formed, e.g. SiO$_2$, may form a distribution of nanoparticles. Generally, acidic solutions may produce compact micro-porous nanoparticles having particles with an average diameter of less than about 10 nm. These particles may agglomerate and form a network by linking reactions; e.g. condensation reactions. As the network grows the viscosity and density of the solution changes, eventually resulting in the formation of the wet sol-gel (e.g. before sintering/heating/evaporating removes the excess moisture). This final composition is influenced by a number of parameters, including solution pH and the ratio of water to alkoxide; R=H$_2$O/Si(OR)$_4$.

Alkoxides that may be used in the sol-gel process include tetraethyl orthosilicate (TEOS) and/or tetramethyl orthosilicate (TMOS). Silicon may provide final metal oxide films having high transparencies, and high physical and chemical stabilities, while also reacting at slow reaction rates with water, in the absence of a catalyst. In some embodiments, alkoxides may be prepared by adding alcohol with silicon tetrachloride (SiCl$_4$) by, SiCl$_4$+EtOH  Si(OEt)$_4$+4HCl.

In some embodiments of the present disclosure, a sol-gel solution containing one or more alkoxides and/or one or more catalysts may be reacted until a desired solid content and/or a desired solution viscosity is attained. The resulting wet sol-gel may then be applied to the top surface of a PV device, e.g. a perovskite layer, by any suitable method such as dip coating, spin coating, etc. The "wet" film resulting from the application step may subsequently be dried and/or thermally treated to remove and/or reduce the liquid from the sol-gel to produce a final solid, glassy and/or ceramic metal-oxide containing layer on top of the perovskite layer. Such sol-gel methods may be repeated one or more times to produce one or more metal oxide layers on the perovskite layer of a PV device. These resultant metal oxide layers, while providing protection from the environment, may also be substantially transparent to light. Silica layers, produced for example from one or more silicon alkoxides, may be very stable and resistant to thermal degradation, while also providing a protective layer that prevents any underlying perovskite layer from exposure to the outside environment; e.g. air, oxygen, moisture, etc.

In some embodiments of the present disclosure, a metal alkoxide layer may be deposited on a perovskite layer by a two-step method as follows. In a first step, a liquid alkoxide precursor (e.g. tetraethylorthosilicate) may be mixed in a solvent (e.g. ethanol) and hydrolyzed by mixing with water and hydrochloric acid in a molar ratio 1:(10-15):(0.5-1.5):(0.001-0.015) (alkoxide:solvent:water:HCl). This initial water addition may equal between 0 to 50% of the stoichiometric amount required to go to 100% completion of the hydrolysis reaction. This solution may be kept at a temperature between 55° C. and 65° C.; e.g. in a water bath for a time between 1 hour and 2 hours. Next, the resultant solution may be cooled down to about 40° C. temperature. The second step may begin by adding additional water into the solution and maintaining a temperature between 30° C. and 50° C. for a time period between 0.5 hour and 1.5 hours. Over time, the condensation reactions result in the formation of a branched, solid silica phase within the remaining liquid phase. The pH of the solution may be controlled to a pH value between 1 and 3 to obtain a final sol-gel having a dense silica phase. Finally, in a third step, the liquid-containing sol-gel may be deposited on the PV device, e.g. by dip coating, followed by one or more drying and/or thermal treatment steps.

The final sol-gel coating may be an organic-inorganic coating with a network structure made up of an inorganic, component (essentially the inorganic silica sol-gel) and an organic component that can be (either or both) cross-linked and interpenetrating. It may be a transparent, glassy, coating layer that also acts as a diffusion barrier against oxygen and water vapor. The properties of the hybrid coating layer are determined by the inorganic and organic components. For the organic-inorganic epoxide hybrid coating, the Si—O—Si network (e.g. originating from TEOS) is cross-lined and interpenetrated with an organic epoxide component (e.g. originating from opening the epoxide ring of GPTMS). Hybrid networks may be synthesized by using low molecular weight organoalkoxysilanes as one or more of the precursors for the sol-gel reaction in which organic groups are introduced within an inorganic network through the (triple bond)-Si-(single bond)-C-(single bond) bond. Organic/inorganic hybrid network materials may also be formed via the co-condensation of functionalized oligomers or polymers with metal alkoxides in which chemical bonding is established between inorganic and organic phases. Hybrid networks can also be formed by interpenetrating networks and simultaneous formation of inorganic and organic phases. By using triethoxysliane R'Si(OR)$_3$ as the precursor with R' being a polymerizable group such as an epoxy group, an organic network can be formed within the inorganic network by photochemical and/or thermal curing of such groups or by forming inorganic/organic simultaneous interpenetrating networks, where both inorganic glass and polymer formation occur concurrently. These transparent composites may be synthesized through a synchronous application of the aqueous ring-opening metathesis polymerization of cyclic alkenyl monomers and the hydrolysis and condensation of metal alkoxides. Other examples of functionalized oligomers and polymers that may be covalently incorporated into an inorganic sol-gel network are polystyrenes, polyamide, poly(ethyleneimine), epoxy, poly(ethylene oxide), poly (oxypropylene), poly(arylene ether phosphine oxide), poly (arylene ether sulfone) (PSF), cellulose acetate, polyacrylics, polyacrylonitrile, and polybutadiene. All of these oligomers have been incorporated into inorganic networks utilizing terminal functional groups such as triethoxysilane. An example of a specific composition for a sol-gel layer is triethoxysilane+3-glycidoxyproplytrimethoxysilane+diphenylsilanediol+barium hydroxide monohydrate. After sintering, the $O_2$ permeability of these films can range from between $10^{-11}$ and $10^{-9}$ ml mm m$^{-2}$ s$^{-1}$ GPa$^{-1}$ and the $H_2O$ permeability of these films can fall roughly between $10^{-3}$ and $10^{-5}$ ml mm m$^{-2}$ s$^{-1}$ GPa$^{-1}$. Thickness of these films is tunable, with films generally between 0.5 and 5 μm thick.

Preparation of Perovskite Solar Cells

Fluorine-doped tin oxide (FTO) substrates (TEC15, Hartford, USA) were cleaned by immersing in a base bath (5 wt % NaOH ethanol solution) overnight, and rinsed thoroughly with deionized water and ethanol. A thin compact $TiO_2$ layer was deposited on top of FTO by spray pyrolysis using 0.2 M Ti(IV) bis(ethyl acetoacetate)-diisopropoxide in 1-butanol solution at 450° C. For mesoporous structure, 280 nm and 850 nm $TiO_2$ layers were printed using a screen printer by controlling emulsion thickness of the screens. The perovskite film was prepared by an anti-solvent approach. The thickness of the perovskite film was controlled by changing precursor concentration (40-60 wt %) and spin-coating speed (2000-5000 rpm). Then, a hole transport layer (HTL) was cast on top of the perovskite film by spin-coating a spiro-OMeTAD solution at 3000 rpm for 30 seconds. The spiro-OMeTAD solution was composed of 80 mg 2,2',7,7'-tetrakis(N,N-dip-methoxyphenylamine)-9,9'-spirobifluorene (spiro-MeOTAD), 30 μL bis(trifluoromethane)sulfonimide lithium salt stocking solution (500 mg Li-TFSI in 1 mL acetonitrile), and 30 μL 4-tert-butylpyridine (TBP), and 1 mL chlorobenzene solvent. Finally, a 150-nm silver film was deposited on top of HTL by a thermal evaporator using a shallow mask.

Preparation of Protective Coatings

Three coating were prepared: an inorganic silica sol gel, an organic-inorganic epoxide hybrid, and an organic-inorganic vinyl hybrid. 3-Glycidoxyproplytrimethoxysilane (GPTMS, ≥98%, Sigma Aldrich) and vinyl tetraethyl orthosilicate (VTEOS, ≥98%, Sigma Aldrich) were used as the organically modified precursors. Tetraethyl orthosilicate (TEOS, reagent grade, >98%, Sigma Aldrich) was used as the inorganic precursor. Diphenylsilanediol (DPSD, 95%, Sigma Aldrich) was used as the organic cross-linker and barium hydroxide monohydrate (Ba(OH)$_2$.H$_2$O, Sigma Aldrich) was used to catalyze the condensation reaction. Titania was prepared from titanium propoxide (Ti(OC$_3$H$_7$)$_4$, 98%, Sigma Aldrich) using acetyl acetone and glacial acetic acid as chelating agents and was used to increase the density of the films.

An Inorganic silica sol-gel coating was prepared by mixing TEOS, ethanol, and 1M HCl with a molar ratio of 1:12:1 and then stirring under reflux for 90 minutes at 60° C. Then more 1M hydrochloric acid was added to bring the total ratio of TEOS:EtOh:water to 1:12:3 and the solution was stirred under reflux for an additional 1 hour at 40°.

The organic-inorganic hybrid epoxide coating was prepared according to a procedure developed by Nam et al to make passivation layers for organic field-effect transistors. [1] TEOS, GPTMS, DPSD, and Ba(OH)$_2$*H$_2$0 were mixed with a molar ratio 3:1:1:0.04 and stirred under reflux for 4 hours at 90° C. Titania was prepared by mixing 9 mL titanium propoxide and 0.27 mL acetyl acetone and stirring for 15 minutes. Then, 0.2 mL of 2-propanol and 0.075 mL of glacial acetic acid were added to the titania mixture and it was stirred for 1 hour. Titania was added to the DPSD/GPTMS/TEOS solution with a ratio of 0.5:1 TiO$_2$ to GPTMS and this mixture was stirred for 2 hours at room temperature to form the final epoxide hybrid coating.

The organic-inorganic hybrid vinyl coating was prepared using a procedure developed by Jitianu (*Angew. CHem. Int. Ed.* 126, 10056-10061, 2014) VTEOS and 2-Butoxyethanol (2-BE, Sigma Aldrich), and 0.01M acetic acid ($H_2O$) for a final molar ratio of 1:2:6 VTEOS:2-BE:$H_2O$. This mixture was stirred at room temperature for 24 hours before 0.1 wt % benzoyl peroxide was added as a free radical initiator. This mixture was then stirred for an additional 4 hours prior to coating samples.

Application of the Protective Coatings

Perovskite solar cells were dipped into the silica sol-gel solution and withdrawn at 100 mm/minute. They were placed on a watch glass to dry in air for 15 minutes and then further dried at 50° C. for 2 hours on a hot plate. The organic-inorganic sol-gel epoxide hybrid coating was applied both with dip-coating and spin-coating. Perovskite solar cells were dipped into the epoxide solution and withdrawn at 100 mm/minute. Spin coating was performed by applying 100 μL of the sol-gel solution to samples spinning at 2500 RPM for 2 minutes. The samples were allowed to dry in air for 15 minutes and then dried at 90° C. for 2 hours on a hot plate.

The procedure for applying the organic-inorganic sol-gel epoxide hybrid coating was similar to the two previous procedures but also included a UV curing step. Perovskite solar cells were dipped into the vinyl solution and withdrawn at 100 mm/minute. They were placed on a watch glass to dry in air for 15 minutes and then further dried at 70° C. for 30 minutes on a hot plate. UV irradiation was performed on the samples for 30 minutes followed by a NaOH wash to remove any excess BPO. The samples were then further dried at 70° C. for 12 hours.

Qualitative Measurement of Perovskite Degradation

A UV-VIS-IR spectrophotometer was used to measure the absorbance of the perovskite solar cells over the solar spectrum. As perovskite degrades, there is an increase in reflection in the yellow (~600 nm) region due to the formation of yellow lead iodide. This method qualitatively measures the degradation of the solar cells by comparing the absorption spectrum to a fresh cell and a completely degraded cell.

Measurement of Cell Efficiency

The current density-voltage (J-V) curves were measured by a source meter (Keithley 2400) under AM 1.5G illumination (Oriel Sol3A class AAA solar simulator) at a scan rate of 20 mV/s. A typical active area of 0.12 $cm^2$ was defined using a non-reflective mask for the J-V measurements.

FIG. 3 illustrates an embodiment of the present disclosure, the architecture of a planar perovskite solar cell (PSC) protected by an organic-inorganic sol-gel epoxide hybrid coating. Such a device 300 may be manufactured according to methods described herein. The example device 300 shown in FIG. 3 includes two parts; perovskite PV device layers 310 and protective layers 320. The perovskite PV device layers 310 may include a fluorine-doped tin oxide layer 330. The perovskite PV device layers 310 may include a titanium dioxide layer 340. The perovskite PV device layers 310 may include a perovskite layer 350, as described above. The perovskite PV device layers 310 may include a hole transport layer 360, with examples including spiro-OMeTAD and PTAA (Poly[bis(4-phenyl)(2,4,6-trimethylphenyl)amine]). The perovskite PV device layers 310 may include a contact layer 370, with examples including gold, silver, and aluminum. The protective layers 320 may include one or more intervening layers 380, with examples including aluminum oxide ($Al_2O_3$), chromium oxide ($Cr_2O_3$), and nickel oxide (NiO), and/or any other suitable metal oxide and/or protective layer. The protective layers 320 may include one or more sol-gel-derived solid metal oxide layers 390, as described above.

Results

FIG. 4 illustrates x-ray diffraction analysis that shows peaks corresponding to $CH_3NH_3PbI_3$ (as indicated by asterisks) are present before degradation (dashed line) but not after (solid line). In their place are peaks that correspond to $PbI_2$ and $I_2$ (as indicated by plus signs). This demonstrates that $CH_3NH_3PbI_3$ degrades to $PbI_2$ and $I_2$ in the presence of water and also leads to a convenient way to monitor degradation. $PbI_2$ is bright yellow, so a visible color change can be considered a sufficient indication that this process has occurred. FTO glass coated with $TiO_2$, perovskite, and spiro-OMeTAD was partially dipped in an inorganic sol-gel and dried at 50° C. After 10 hours, a color change was observed in the uncoated section, but no color change was visible in the coated section until 100 hours had passed. FIG. 5 shows the sharp contrast between the protected and unprotected sections after only 48 hours. Specifically, Panel A and Panel B of FIG. 5 illustrate "bare" and protected portions of a perovskite film, at zero hours and 48 hours respectively. Panel B of FIG. 5 clearly illustrates a color degradation (lightening in color) of the bare perovskite (top quarter), whereas the protected portion (bottom three-quarters) remains visually unchanged.

Silica sol-gels may be sintered at temperatures up to 400° C. to achieve a dense film. Such high temperatures may destroy a perovskite solar cell. However, organic-inorganic sol-hybrid sol-gels have the added benefit of forming dense films at temperatures below 150° C. FIG. 6 shows similar samples that were coated with an epoxy hybrid sol-gel, where no color change was observed in the samples for over two weeks; Panel A of FIG. 6 illustrates a film at time equal to zero, whereas Panel B of FIG. 6 illustrates the film after about 18 days. The difference in performance of the two coatings was most likely due to differences in film densities. The epoxy hybrid sol-gel benefits from more cross-linking and had a more dense structure than a silica sol-gel that had not undergone a high-temperature sintering step. A porous film provides less resistance to water vapor penetrating the film and more water eventually comes into contact with the underlying perovskite.

FIG. 7 shows how coated cell efficiency dropped little just after coating, but significantly just after 30 minutes under light-soaking conditions from >14% to <6%. After 1 hour, the cell efficiency was below 3%; solid lines represent an "as-coated" sample, dashed lines represent "before coating" samples, and the dash-dotted lines represent the "after 30 minutes" samples. However, no color change was observed in the protected solar cell, whereas an unprotected cell showed color change in the same time period. This means that it is unlikely that the efficiency drop of the protected cell was due to perovskite degradation. Corrosion of the silver contacts was observed, which is consistent with the formation of silver iodide when perovskite and silver come into contact. This indicates that it was the hole transport layer that was degrading during the coating process instead of the perovskite film. Spiro-OMeTAD is a sensitive organic molecule, so some interaction between the sol-gel and the spiro layer is likely. Such an interaction may be eliminated in some embodiments of the present disclosure by providing at least one intervening layer (e.g. metal oxide) (see reference number 380 of FIG. 3) between the perovskite layer 350 and the sol-gel-derived solid metal oxide layer 390.

FIG. 8 summarizes a method for producing perovskite PV devices as described above. The method may begin with cleaning a substrate 800, where the substrate may be for example, a fluorine-doped tin oxide layer. The cleaning the substrate 800 may be accomplished by cleaning with a suitable solvent. After cleaning the substrate 800, the method may proceed by depositing a $TiO_2$ layer 810 onto the substrate, for example by spray hydrolysis. After depositing the $TiO_2$ layer 810, the method may proceed with depositing a perovskite layer 820 onto the $TiO_2$ layer, as described above. After depositing the perovskite layer 820, the method may proceed with depositing a hole transport layer 830 onto the perovskite layer, for example by spin-coating a spiro-OMeTAD layer onto the perovskite layer. After depositing the hole transport layer 830, the method may proceed with depositing a contact layer 840 onto the hole transport layer, for example by thermal evaporative methods. Next, the method may proceed by depositing at least one intervening layer 850 (e.g. a metal oxide layer) onto the contact layer, for example by atomic layer deposition (ALD). Finally, the method may conclude with the depositing of at least one a sol-gel-derived solid metal oxide layer 860, e.g. another metal oxide layer and/or an organic-inorganic hybrid layer, onto and/or adjacent to the intervening layer.

EXAMPLES

Example 1

A method comprising: in a first mixture comprising a metal alkoxide and water, reacting at least a portion of the metal alkoxide and at least a portion of the water to form a second mixture comprising a solid metal oxide phase dispersed in the second mixture; applying the second mixture onto a surface of a device comprising an intervening layer adjacent to a perovskite layer such that the intervening layer is between the second mixture and perovskite layer; and treating the second mixture, such that the solid metal oxide phase is transformed to a first solid metal oxide layer such that the intervening layer is between the first solid metal oxide layer and the perovskite layer.

Example 2

The method of Example 1, wherein the metal alkoxide comprises $Si(OR)_4$ and the R group comprises an alkyl group.

Example 3

The method of Example 2, wherein the alkyl group comprises at least one of a methyl group, an ethyl group, a propyl group, or a butyl group.

Example 4

The method of Example 2, wherein the R group comprises a polymeric group.

Example 5

The method of Example 4, wherein the polymeric group comprises at least one of a polystyrene group, a polyamide group, a poly(ethyleneimine) group, an epoxy group, a poly(ethylene oxide) group, a poly(oxypropylene) group, a poly(arylene ether phosphine oxide) group, a poly(arylene ether sulfone) group, a cellulose acetate group, a polyacrylic group, a polyacrylonitrile group, or a polybutadiene group.

Example 6

The method of Example 2, wherein the solid metal oxide phase comprises a first network of interconnected silicon atoms comprising at least one of $SiO_2$, $SiO_{1.5}OH$, $SiO(OH)_2$, $SiO_{0.5}(OH)_3$, $SiO_{1.5}R$, $SiOR_2$, $SiO_{0.5}R_3$, $SiO_{0.5}(OH)R_2$, $SiO_{0.5}(OH)_2R$, or $SiO(OH)R$ and a first amount of unreacted $Si(OR)_4$.

Example 7

The method of Example 6, wherein the first solid metal oxide layer comprises a second network of interconnected silicon atoms comprising at least one of $SiO_2$, $SiO_{1.5}OH$, $SiO(OH)_2$, $SiO_{0.5}(OH)_3$, $SiO_{1.5}R$, $SiOR_2$, $SiO_{0.5}R_3$, $SiO_{0.5}(OH)R_2$, $SiO_{0.5}(OH)_2R$, or $SiO(OH)R$ and a second amount of unreacted $Si(OR)_4$ that is less than the first amount.

Example 8

The method of Example 1, wherein the first mixture further comprises an alcohol.

Example 9

The method of Example 8, wherein the alcohol comprises at least one of a primary alcohol, a secondary alcohol, or a tertiary alcohol.

Example 10

The method of Example 9, wherein the primary alcohol comprises at least one of methanol, ethanol, propanol, or butanol.

Example 11

The method of Example 6, wherein the first mixture further comprises $R'[Si(OR)_3]_x$ where x is an integer value between 1 and 10 inclusively.

Example 12

The method of Example 11, wherein the R' group comprises an organic group.

Example 13

The method of Example 12, wherein the organic group comprises at least one of an alkane group, an alkene group, or an aromatic group.

Example 14

The method of Example 7, wherein the first network further comprises at least one of $SiO_{1.5}R'_{0.5}$, $SiOR'$, $SiO_{0.5}R'_{1.5}$, $SiO(OH)R'_{0.5}$, $SiO_{0.5}(OH)R'$, or $Si(OH)R'_{1.5}$.

Example 15

The method of Example 14, wherein the second network further comprises at least one of $SiO_{1.5}R'_{0.5}$, $SiOR'$, $SiO_{0.5}R'_{1.5}$, $SiO(OH)R'_{0.5}$, $SiO_{0.5}(OH)R'$, or $Si(OH)R'_{1.5}$.

Example 16

The method of Example 1, wherein the reacting is performed at a pH between 1.0 and 3.0.

Example 17

The method of Example 16, wherein the pH is maintained by adding an acid to the first mixture.

Example 18

The method of Example 17, wherein the acid comprises at least one organic or inorganic acid.

Example 19

The method of Example 18, wherein the acid is comprises at least one of hydrochloric acid, sulfuric acid, or nitric acid.

Example 20

The method of Example 1, wherein the reacting is performed at a temperature between about 25° C. and about 95° C.

Example 21

The method of Example 1, wherein the applying is performed by at least one of dip coating, curtain coating, or spin coating.

Example 22

The method of Example 1, wherein the intervening layer comprises a second solid metal oxide layer.

Example 23

The method of Example 22, wherein the second solid metal oxide layer is substantially transparent to sunlight.

Example 24

The method of Example 23, wherein the second solid metal oxide layer comprises nickel oxide.

Example 25

The method of Example 24, wherein the second solid metal oxide layer has a thickness between 10 Å and 500 Å.

Example 26

The method of Example 1, wherein the perovskite comprises $ABX_3$, where X comprises an anion, A comprises a first cation, and B comprises a second cation.

Example 27

The method of Example 26, wherein the first cation comprises an alkyl ammonium cation.

Example 28

The method of Example 26, wherein the second cation comprises a metal.

Example 29

The method of Example 26, wherein the anion comprises a halogen.

Example 30

The method of Example 1, further comprising prior to the applying, depositing the second solid metal oxide layer onto the perovskite layer.

Example 31

The method of Example 30, wherein the depositing is performed by atomic layer deposition.

Example 32

The method of Example 30, further comprising prior to the depositing, forming the perovskite layer.

Example 33

The method of Example 32, wherein the forming is performed by at least one of a solution method or a vapor phase method.

Example 34

The method of Example 1, wherein the treating comprises at least one of heating the second mixture or exposing the second mixture to a gas.

Example 35

The method of Example 34, wherein the treating is performing by heating the second mixture to a temperature between 30° C. and 100° C.

Example 36

The method of Example 34, wherein the gas is air.

Example 37

A device comprising: a perovskite layer; and at least one metal oxide layer adjacent to the perovskite layer.

Example 38

The device of Example 37, wherein the at least one metal oxide layer comprises a silica-containing layer.

Example 39

The device of Example 38, wherein the at least one metal oxide layer further comprises a nickel oxide layer positioned between the perovskite layer and the silica-containing layer.

Example 40

The device of Example 37, further comprising a contact layer positioned between the perovskite layer and metal oxide layer.

Example 41

The device of Example 40, further comprising a hole-transport layer positioned between the contact layer and the perovskite layer.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A method comprising:
   in a first mixture comprising a metal alkoxide and water, reacting at least a portion of the metal alkoxide and at least a portion of the water to form a second mixture comprising a solid metal oxide phase;
   applying the second mixture onto a surface of a device comprising an intervening layer adjacent to a photovoltaic perovskite layer such that the intervening layer is between the second mixture and the photovoltaic perovskite layer; and
   treating the second mixture, such that the solid metal oxide phase is transformed to a first solid metal oxide layer such that the intervening layer is positioned between the first solid metal oxide layer and the photovoltaic perovskite layer, wherein:
   the photovoltaic perovskite layer comprises an organic cation.

2. The method of claim 1, wherein:
   the metal alkoxide comprises $Si(OR)_4$, and
   the R group comprises at least one of an alkyl group or a polymeric group.

3. The method of claim 2, wherein the polymeric group comprises at least one of a polystyrene group, a polyamide group, a poly(ethyleneimine) group, an epoxy group, a poly(ethylene oxide) group, a poly(oxypropylene) group, a poly(arylene ether phosphine oxide) group, a poly(arylene ether sulfone) group, a cellulose acetate group, a polyacrylic group, a polyacrylonitrile group, or a polybutadiene group.

4. The method of claim 2, wherein the first solid metal oxide phase comprises a first network of interconnected silicon atoms comprising at least one of $SiO_2$, $SiO_{1.5}OH$, $SiO(OH)_2$, $SiO_{0.5}(OH)_3$, $SiO_{1.5}R$, $SiOR_2$, $SiO_{0.5}R_3$, $SiO_{0.5}(OH)R_2$, $SiO_{0.5}(OH)_2R$, or $SiO(OH)R$ and a first amount of unreacted $Si(OR)_4$.

5. The method of claim 4, wherein the first solid metal oxide layer comprises a second network of interconnected silicon atoms comprising at least one of $SiO_2$, $SiO_{1.5}OH$, $SiO(OH)_2$, $SiO_{0.5}(OH)_3$, $SiO_{1.5}R$, $SiOR_2$, $SiO_{0.5}R_3$, $SiO_{0.5}(OH)R_2$, $SiO_{0.5}(OH)_2R$, or $SiO(OH)R$ and a second amount of unreacted $Si(OR)_4$ that is less than the first amount.

6. The method of claim 1, wherein the first mixture further comprises an alcohol.

7. The method of claim 5, wherein:
   the first mixture further comprises $R'[Si(OR)_3]_x$ where x is an integer value between 1 and 10 inclusively, and
   the R' group comprises an organic group.

8. The method of claim 7, wherein the organic group comprises at least one of an alkane group, an alkene group, or an aromatic group.

9. The method of claim 7, wherein the first network further comprises at least one of $SiO_{1.5}R'_{0.5}$, $SiOR'$, $SiO_{0.5}R'_{1.5}$, $SiO(OH)R'_{0.5}$, $SiO_{0.5}(OH)R'$, or $Si(OH)R'_{1.5}$.

10. The method of claim 9, wherein the second network further comprises at least one of $SiO_{1.5}R'_{0.5}$, $SiOR'$, $SiO_{0.5}R'_{1.5}$, $SiO(OH)R'_{0.5}$, $SiO_{0.5}(OH)R'$, or $Si(OH)R'_{1.5}$.

11. The method of claim 1, wherein the reacting is performed at a temperature between 25° C. and 95° C.

12. The method of claim 1, wherein the applying is performed by at least one of dip coating, curtain coating, or spin coating.

13. The method of claim 1, wherein the intervening layer comprises a second solid metal oxide layer.

14. The method of claim 13, wherein the second solid metal oxide layer is substantially transparent to sunlight.

15. The method of claim 14, wherein the second solid metal oxide layer comprises nickel oxide.

16. The method of claim 13, wherein the second solid metal oxide layer has a thickness between 10 Å and 500 Å.

17. The method of claim 1, wherein the perovskite comprises $ABX_3$, where X comprises an anion, A comprises the organic cation, and B comprises a second cation.

18. The method of claim 13, further comprising prior to the applying, depositing the second solid metal oxide layer onto the perovskite layer.

19. The method of claim 18, wherein the depositing is performed by atomic layer deposition.

20. The method of claim 18, further comprising prior to the depositing, forming the perovskite layer.

21. The method of claim 20, wherein the forming is performed by at least one of a solution method or a vapor phase method.

22. The method of claim 1, wherein the treating comprises at least one of heating the second mixture or exposing the second mixture to a gas.

* * * * *